United States Patent [19]

Brown

[11] Patent Number: 4,464,613
[45] Date of Patent: Aug. 7, 1984

[54] BLOCKING OSCILLATOR FOR A RECIPROCATING ELECTROMAGNETIC ACTUATOR

[75] Inventor: Ralph V. Brown, Cayuta, N.Y.

[73] Assignee: Facet Enterprises, Inc., Tulsa, Okla.

[21] Appl. No.: 467,522

[22] Filed: Feb. 17, 1983

[51] Int. Cl.³ .................... H02K 33/00; H02K 33/02
[52] U.S. Cl. .................................... 318/119; 318/128; 318/132; 318/129; 318/114; 318/130; 331/112; 361/210; 361/203
[58] Field of Search ............... 318/114, 119, 124, 126, 318/127, 128, 129, 130, 131, 132, 133; 361/210, 203; 331/112

[56] References Cited
U.S. PATENT DOCUMENTS

| | | | |
|---|---|---|---|
| 3,293,516 | 12/1966 | Maier et al. | 318/128 |
| 3,629,674 | 12/1971 | Brown | 318/128 |
| 3,922,589 | 11/1975 | Peckingham | 318/129 X |
| 4,080,552 | 3/1978 | Brown | 318/128 |
| 4,101,950 | 7/1978 | Hager et al. | 361/203 |
| 4,122,378 | 10/1978 | Brown | 318/132 X |

Primary Examiner—G. Z. Rubinson
Assistant Examiner—Paul Shik Luen Ip
Attorney, Agent, or Firm—Remy J. VanOphem

[57] ABSTRACT

A blocking oscillator for a reciprocating electromagnetic actuator having a solenoid coil, a detection coil for generating a control signal in response to a charge in the magnetic field generated by the solenoid coil, a silicon Darlington amplifier responsive to the control signal to control the current through said solenoid coil, and a diode connected in series with the collector of the Darlington amplifier rendering the Darlington amplifier immune to reverse voltage and transient signals.

16 Claims, 2 Drawing Figures

BLOCKING OSCILLATOR FOR A RECIPROCATING ELECTROMAGNETIC ACTUATOR

BACKGROUND OF THE INVENTION

1. Field of the Invention

The present invention relates to blocking oscillators for reciprocating electromagnetic actuators and in particular to a blocking oscillator for an electromagnetic fluid pump.

2. Description of the Prior Art

Electromagnetically actuated actuators such as electromagnetic fluid pumps are used for a wide variety of applications. These devices are required to operate over a wide range of temperature and are subject to relatively large voltage fluctuations. Because they are often used in relatively inaccessible places they must be reliable and trouble free.

Many of these electromagnetic actuators embody a blocking oscillator generally of the type disclosed by H. P. Wertheimer et al in U.S. Pat. No. 3,386,616 (May, 1968). The present invention is an improved blocking oscillator circuit, having superior reliability and performance over the blocking oscillators disclosed in my prior patents U.S. Pat. No. 3,629,674 (December, 1971) and U.S. Pat. No. 4,080,552 (March, 1978).

SUMMARY OF THE INVENTION

The present invention comtemplates a blocking oscillator having a solenoid coil reciprocating a biased armature such as the piston in an electromagnetic fluid pump and a detection coil magnetically linked to the solenoid coil. The solenoid coil has an input end receiving electrical power from the positive terminal of an external source. A high gain silicon transistor, connected in series with the solenoid coil, controls the current flow through the solenoid coil.

The silicon transistor has an emitter connected to the output end of the solenoid coil, a base, and a collector. The collector is connected to the negative terminal of the source of electrical power through a diode.

The detection coil has one end connected to the output end of the solenoid coil and the other end connected to the base of the silicon transistor through a pair of serially connected resistances. A bias resistance is connected from between the pair of serially connected resistances to the negative terminal of the external source. A first serially connected diode and resistance are connected between the input and output ends of the solenoid coil, and a second serially connected diode and resistance are connected between the input end of the solenoid coil and the other end of the detection coil. In the preferred embodiment the silicon transistor is a high gain silicon Darlington amplifier.

The advantage of the blocking oscillator is that the diode connected between the negative terminal of the external source and the collector of the silicon transistor reduces the loop gain and prevents high voltage reverse currents from being applied across the silicon transistor rendering it immune to reverse voltage and transient signals.

Another advantage of the blocking oscillator is that it is compatible with a coil assembly having the solenoid coil wound over the detection coil.

These and other advantages of the blocking oscillator will become more apparent from a reading of the detailed description in conjunction with the accompanying drawings.

DETAILED DESCRIPTION OF THE PREFERRED EMBODIMENT

Figure 1:
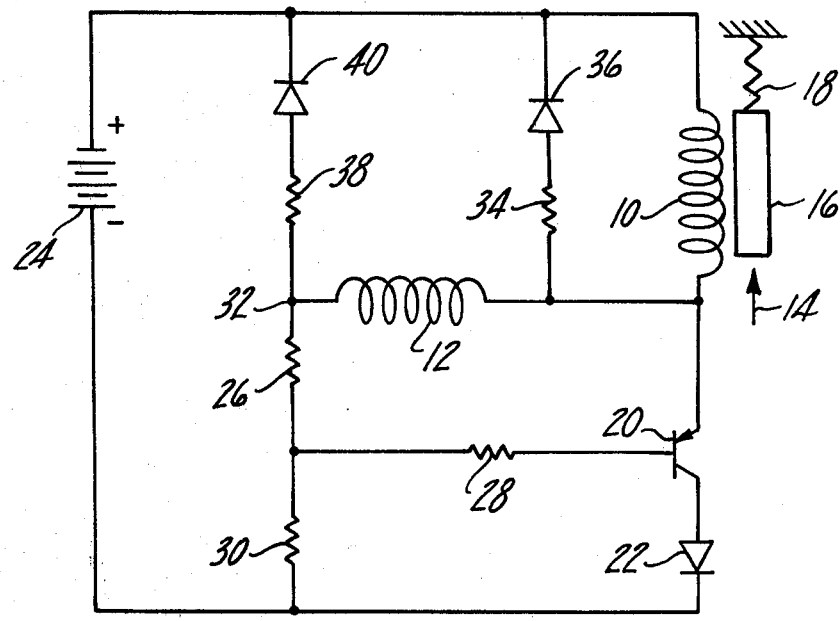
FIG. 1 is an electrical schematic showing the details of the blocking oscillator.

Referring to FIG. 1 there is shown a circuit diagram of the blocking oscillator having a solenoid coil 10 and a detection coil 12. The solenoid coil 10 generates a magnetic field which produces a force 14 urging an armature 16 against the force of a resilient member such as a spring 18. The armature 16 may be a biased piston of an electromagnetic fluid piston pump as disclosed in my prior patent, U.S. Pat. No. 4,080,552.

The input end of the solenoid coil 10 is connected to the positive terminal of a source of electrical power illustrated as a battery 24. The output end of the solenoid coil 10 is connected to one end of the detection coil 12 and to the emitter of a transistor 20. The collector of the transistor 20 is connected to the anode of a diode 22 having its cathode connected to the negative terminal of a source of the battery 24. Those skilled in the art will recognize that the transistor 20 may be replaced by a high gain Darlington transistor without departing from the spirit of the invention.

The other end of the detection coil 12 is connected to the base of the transistor 20 through serially connected resistances 26 and 28 and to the negative terminal of the battery 24 through resistances 26 and 30. With this arrangement the diode 22 provides for a unidirectional flow of collector current from the transistor 20, lowers the loop gain of the circuit, and protects the transistor 20 from accidental reversal of voltages to the circuit and transient signals.

A first serially connected resistance 34 and the diode 36 are connected between the input and the output ends of the solenoid coil 10, to provide a low resistance path for the current induced in the solenoid coil 10 by the collapsing magnetic field when the transistor 20 is turned off.

A second serially connected resistance 38 and a diode 40 are connected between the input end of the solenoid coil 10 and the junction 32 between the detection coil 12 and resistance 26. The serially connected resistance 38 and the diode 40, in conjunction with the serially connected resistance 34 and the diode 36, control the rate of the collapsing magnetic field of the solenoid coil 10 which is a major factor in reducing electromagnetic interference (EMI) emissions.

OPERATION

The operation of the circuit is as follows. Upon the application of electrical power, the resistances 26 and 30 form a voltage divider producing reduced potential applied to the base of the transistor 20 through the resistance 28. This initiates a current flow from the base of the transistor 20 making it conductive, initiating a current flow through the solenoid coil 10.

An increasing current flow through the solenoid coil 10 induces a current flow away from the junction 32 in the detection coil 12. This decreases the potential cross the resistances 26 and 30 increases the base current flow of the transistor 20 until it becomes saturated. With the transistor 20 saturated, the magnetic field generated by the solenoid coil 10 produces a magnetic force 14 on the armature 16 sufficient to move the armature 16 against the force of the spring 18 producing the desired mechanical motion.

Saturation of the transistor 20 and diode also terminates the expansion of the magnetic field produced by the solenoid coil 10 and terminates the current induced in the detection coil 12. This causes the potential at the junction 32 and the base of the transistor 20 to increase, reducing the conductance of the transistor 20, which in turn reduces the current flow through the solenoid coil 10. Reduction of the current flow through the solenoid coil 10 causes the generated magentic field to start to collapse.

The collapsing magnetic field of the solenoid coil 10 induces a current flow towards the junction 32 in the detection coil 12. The increased current flow towards the junction 32 increases the current flow through the resistances 26 and 30 further increasing the potential at the junction 32 which in turn further reduces the base current flow from the transistor 20. This continues until the transistor 20 is turned completely off, terminating the magnetic field generated by the solenoid coil 10 and restoring the circuit to its original condition. Termination of the magnetic field generated by the solenoid coil terminates the magnetic force acting on the armature 16 and the resilient force produced by the spring 18 returns the armature to its starting position.

By appropriate selection of the turns ratio between the solenoid coil 10 and the detection coil 12, as well as the values or the resistances 26 and 30, the oscillation frequency of the circuit may be controlled over a fairly broad range as is known in the art.

The blocking oscillator circuit has the further advantage in that the silicon transistor, or silicon Darlington amplifier, have higher gains than conventional transistors. This significantly reduces the magnitude of the base current required to drive them into saturation and permits the detection coil to be wound with a much finer (smaller diameter) wire. In particular, the detection coil 12 may be wound with a wire size of 40 AWG or smaller, significantly reducing the volume of the coil assembly including the solenoid coil 10 and the detection coil 12.

Figure 2:
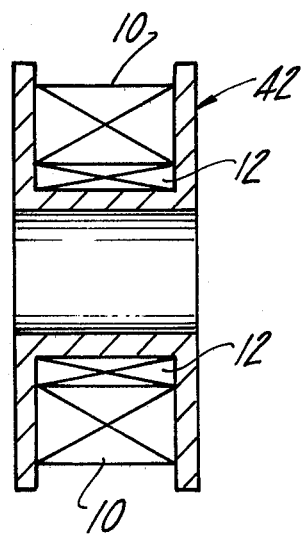
FIG. 2 is a cross section of the coil assembly.

Because of this factor, the blocking oscillator lends itself to the coil configuration in which the detection coil 12 is wound on the inner diameter of a spool 42 with the solenoid coil 10 wound over the detection coil 12 as shown in FIG. 2. This configuration in combination with the blocking oscillator has several advantages which shall be explained hereinafter.

First, the fine wire of the detection coil 12 is buried under the coarser wire of the solenoid coil 10 which makes the coil assembly less susceptible to physical damage. Secondly, it enables the use of more turns in the solenoid coil which increases the ampere turns and reduces the start voltage of the oscillator. Because the solenoid coil has a larger mean diameter, the length of wire is increased thereby increasing its resistance. As a result of this increased resistance the E/R (Voltage/Resistance) current of the solenoid coil is limited to a value within the silicon transistor range. This factor further permits the diode 22 to be inserted in the collector circuit of the transistor providing the circuit with significantly improved reverse voltage immunity yet still permitting the blocking oscillator to start and sustain operation at a reduced voltage. For example, at room temperature, a circuit designed to operate at twelve volts, was able to start and sustain operation at a potential as low as six volts.

Another characteristic of the blocking oscillator with the detection coil wound inside of the solenoid coil is that the oscillatory frequency is an inverse function of the load. In particular, the frequency of a blocking oscillator incorporated in an electromechanical fluid pump of the type disclosed in U.S. Pat. No. 4,080,552 with the detection coil wound inside of the solenoid coil was found to decrease with increased output pressure indicative of zero fluid flow. This feature of the blocking oscillator broadens it's applicability because the lower frequency reduces power consumption and is accompanied by a corresponding reduction in heat generated by the solenoid coil.

It is not intended that the blocking oscillator be limited to the specific electrical components and coil assembly shown in the drawings and discussed in the specification. Those skilled in the art will recognize that changes may be made without departing from the spirit of the invention as set forth in the appended claims.

What is claimed is:

1. A blocking oscillator for reciprocating a biased armature comprising:
   a solenoid coil for generating a magnetic field operative to move said biased armature in response to a current flow therethrough, said solenoid coil having an input end and an output end;
   detection coil means magnetically coupled to said solenoid coil for producing a control signal in response to a change in said magnetic field generated by said solenoid coil, said detection coil means having one end connected to said output end of said solenoid coil and an opposite end;
   transistor means having an emitter connected to said output end of said solenoid coil, a collector and a base;
   doide means having an anode connected to said collector of said transistor means and a cathode;
   a pair of resistances, forming a voltage divider, connected between said opposite end of said detection coil means and said cathode of said diode means; and
   a resistance interconnecting said base of said transistor means with the junction between said pair of resistances.

2. The blocking oscillator of claim 1 wherein said transistor means is a high gain silicon Darlington amplifier.

3. The blocking oscillator of claim 1 wherein said transistor means is a high gain single silicon transistor.

4. The blocking oscillator of claim 1 wherein said detection coil means comprises:
   a spool having an inner diameter; and
   a first predetermined number of turns of a first wire wound around said inner diameter.

5. The blocking oscillator of claim 4 wherein said solenoid coil comprises a second predetermined number of turns of a second wire wound over said first predetermined number of turns of said first wire.

6. The blocking oscillator of claim 5 wherein said first wire has a diameter significantly smaller than said second wire.

7. The blocking oscillator of claim 1 wherein said solenoid coil and said detection coil means comprises:
   a spool having an inner diameter;

a first predetermined number of turns of a fine wire wound about said inner diameter of said spool to form said detection coil means; and a second predetermined number of turns of a coarse wire wound over said first predetermined number of turns of fine wire to form said solenoid coil.

8. The blocking oscillator of claims 1 or 2 further comprising current dissipator means for dissipating the current induced in said solenoid coil by the collapsing magnetic field when said transistor means is turned off, said current dissipator means connected in parallel with at least said solenoid coil.

9. The blocking oscillator of claim 8 wherein said current dissipator means comprises a first serially connected diode and resistance connected between said input and output ends of said solenoid coil.

10. The blocking oscillator of claim 8 wherein said current dissipator means comprises a first serially connected diode and resistance between the input end of said solenoid coil and said opposite end of said detection coil means.

11. The blocking oscillator of claim 10 wherein said current dissipator means further comprises a second serially connected diode and resistance connected between said input and output ends of said solenoid coil.

12. A blocking oscillator comprising:
a spool having an inner diameter;
a first predetermined number of turns of a first wire wound around said inner diameter, said first wire having a first end and a second end;
a second predetermined number of turns of a second wire wound over said first predetermined number of turns, one end of said second wire adapted to receive a positive electrical potential from an external source and an opposite end connected to said first end of said first wire;
a high gain silicon Darlington amplifier having an emitter connected to the opposite end of said second wire, a collector, and a base;
a diode having an anode connected to the collector of said Darlington amplifier and a cathode adapted to receive a negative electrical potential from said source of electrical power; and
a pair of resistances serially connected between said second end of said first wire and said cathode of said diode, the junction between said pair of resistances connected to said base of said Darlington amplifier.

13. The blocking oscillator of claim 12 further comprising a second resistance connected between said junction of said pair of resistances and said base of said Darlington amplifier.

14. The blocking oscillator of claims 12 or 13 further comprising first current dissipator means connected in parallel with said second predetermined number of turns of said second wire.

15. The blocking oscillator of claim 14 wherein said first current dissipator means comprises a first serially connected diode and resistance connected between said one end and said opposite end of said second wire.

16. The blocking oscillator of claim 15 further including second current dissipator means comprising a second serially connected diode and resistance connected between said one end of said second wire and said second end of said first wire.

* * * * *